(12) United States Patent
Hsiao et al.

(10) Patent No.: US 12,133,469 B2
(45) Date of Patent: Oct. 29, 2024

(54) MAGNETIC RANDOM ACCESS MEMORY AND MANUFACTURING METHOD THEREOF

(71) Applicant: TAIWAN SEMICONDUCTOR MANUFACTURING COMPANY, LTD., Hsinchu (TW)

(72) Inventors: Tsung-Chieh Hsiao, Shetou Township (TW); Yu-Feng Yin, Hsinchu County (TW); Liang-Wei Wang, Hsinchu (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 348 days.

(21) Appl. No.: 17/487,049

(22) Filed: Sep. 28, 2021

(65) Prior Publication Data

US 2022/0310907 A1    Sep. 29, 2022

Related U.S. Application Data

(60) Provisional application No. 63/166,883, filed on Mar. 26, 2021.

(51) Int. Cl.
| | |
|---|---|
| H10N 50/01 | (2023.01) |
| G11C 11/16 | (2006.01) |
| H10B 61/00 | (2023.01) |
| H10N 50/80 | (2023.01) |
| H10N 50/85 | (2023.01) |

(52) U.S. Cl.
CPC ............ *H10N 50/01* (2023.02); *G11C 11/161* (2013.01); *H10B 61/22* (2023.02); *H10N 50/80* (2023.02); *H10N 50/85* (2023.02)

(58) Field of Classification Search
CPC ........ H10N 50/01; H10N 50/80; H10N 50/85; H10N 50/10; G11C 11/161; H10B 61/22; H10B 61/00
See application file for complete search history.

(56) References Cited

U.S. PATENT DOCUMENTS

| | | | |
|---|---|---|---|
| 10,727,401 B2 | 7/2020 | Niu et al. | |
| 11,063,206 B2 * | 7/2021 | Wang | .................. G11C 11/161 |
| 11,849,648 B2 * | 12/2023 | Wang | .................. H10N 50/01 |
| 2019/0088863 A1 * | 3/2019 | Lu | ........................ H10N 70/826 |
| 2019/0157344 A1 | 5/2019 | Wei et al. | |

(Continued)

*Primary Examiner* — J. E. Schoenholtz
(74) *Attorney, Agent, or Firm* — STUDEBAKER & BRACKETT PC

(57) ABSTRACT

In a method of manufacturing a semiconductor device, a cell structure is formed. The cell structure includes a bottom electrode, a magnetic tunnel junction (MTJ) stack disposed on the bottom electrode and a hard mask layer disposed on the MTJ stack. A first insulating cover layer is formed over sidewall of the MTJ stack. A second insulating cover layer is formed over the first insulating cover layer and the hard mask layer. A first interlayer dielectric (ILD) layer is formed. The hard mask layer is exposed by etching the first ILD layer and the second insulating cover layer. A second ILD layer is formed. A contact opening is formed in the second ILD layer by patterning the second ILD layer and removing the hard mask layer. A conductive layer is formed in the contact opening so that the conductive layer contacts the MTJ stack.

20 Claims, 12 Drawing Sheets

(56) References Cited

U.S. PATENT DOCUMENTS

| | | | |
|---|---|---|---|
| 2020/0373478 A1* | 11/2020 | Wang | G11C 11/16 |
| 2021/0020828 A1* | 1/2021 | Wang | H10N 50/01 |
| 2021/0233812 A1* | 7/2021 | Reznicek | H01L 21/76843 |
| 2021/0305499 A1* | 9/2021 | Xie | H10N 50/10 |
| 2021/0399209 A1* | 12/2021 | Wang | H10B 61/00 |
| 2022/0208604 A1* | 6/2022 | Zhu | C23C 16/0281 |
| 2022/0302374 A1* | 9/2022 | Wang | H10B 61/00 |
| 2023/0006131 A1* | 1/2023 | Chung | H10N 50/01 |

* cited by examiner

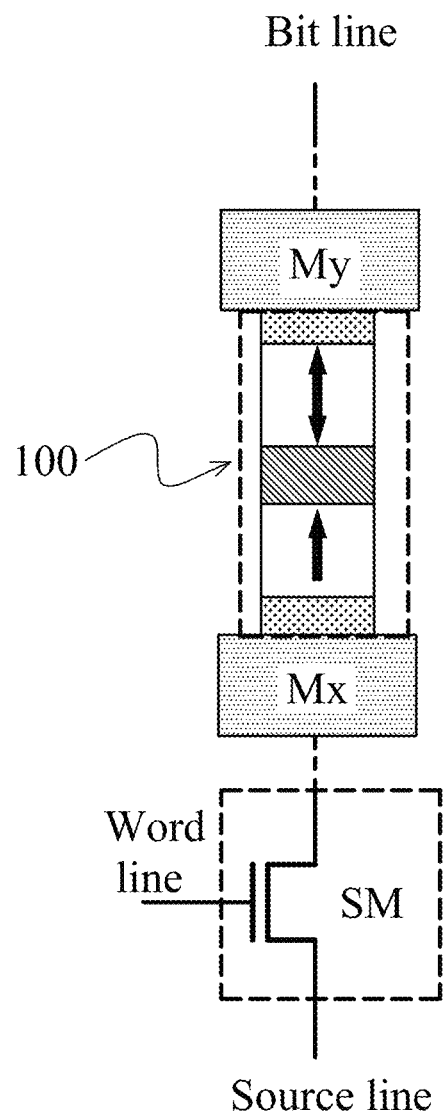
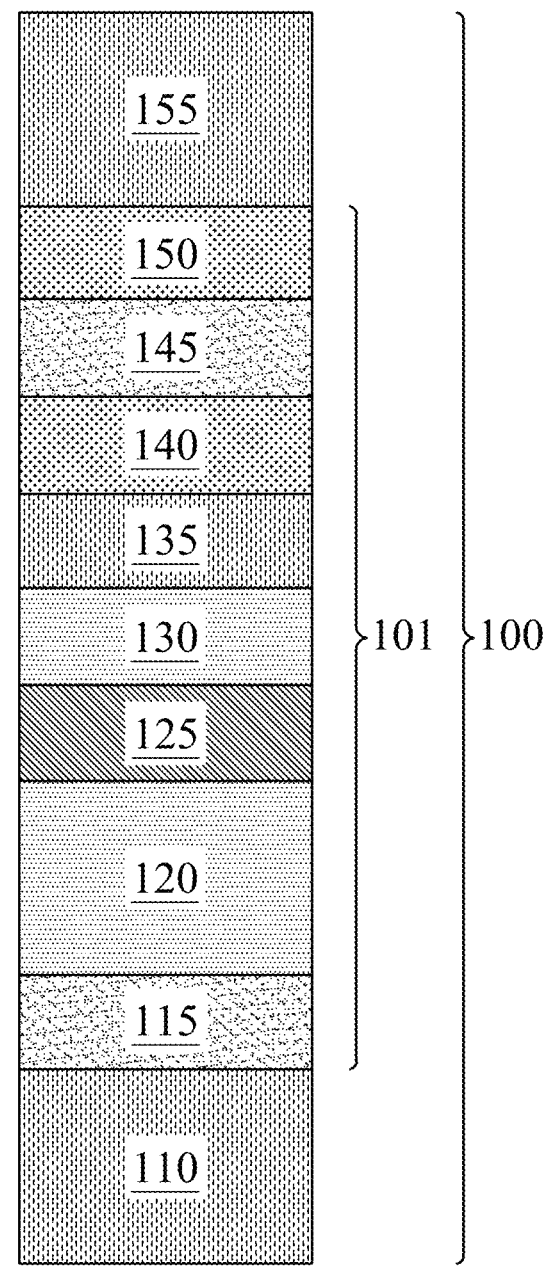
FIG. 1A
FIG. 1B

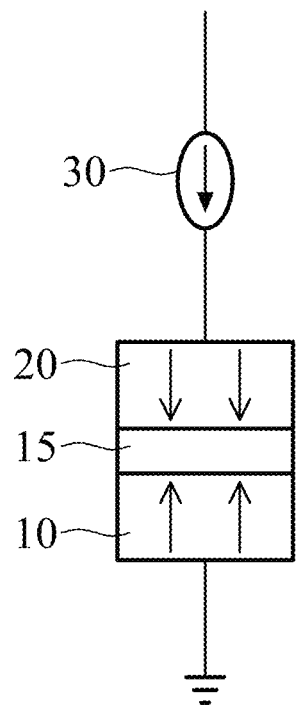
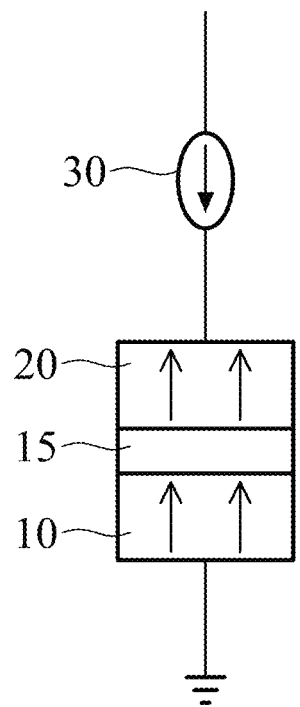
FIG. 3A          FIG. 3B
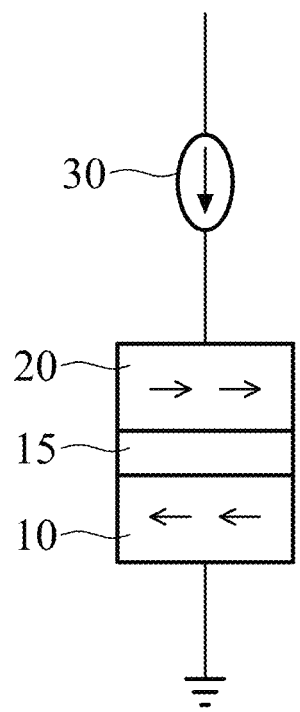
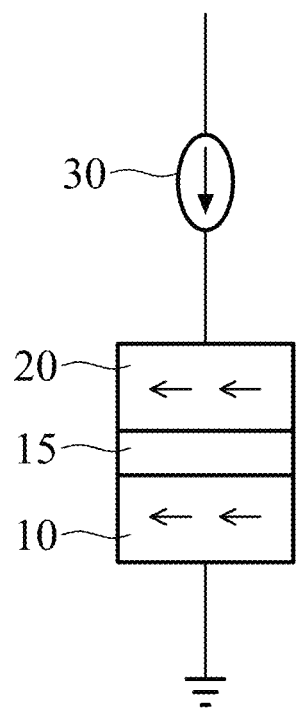
FIG. 3C          FIG. 3D

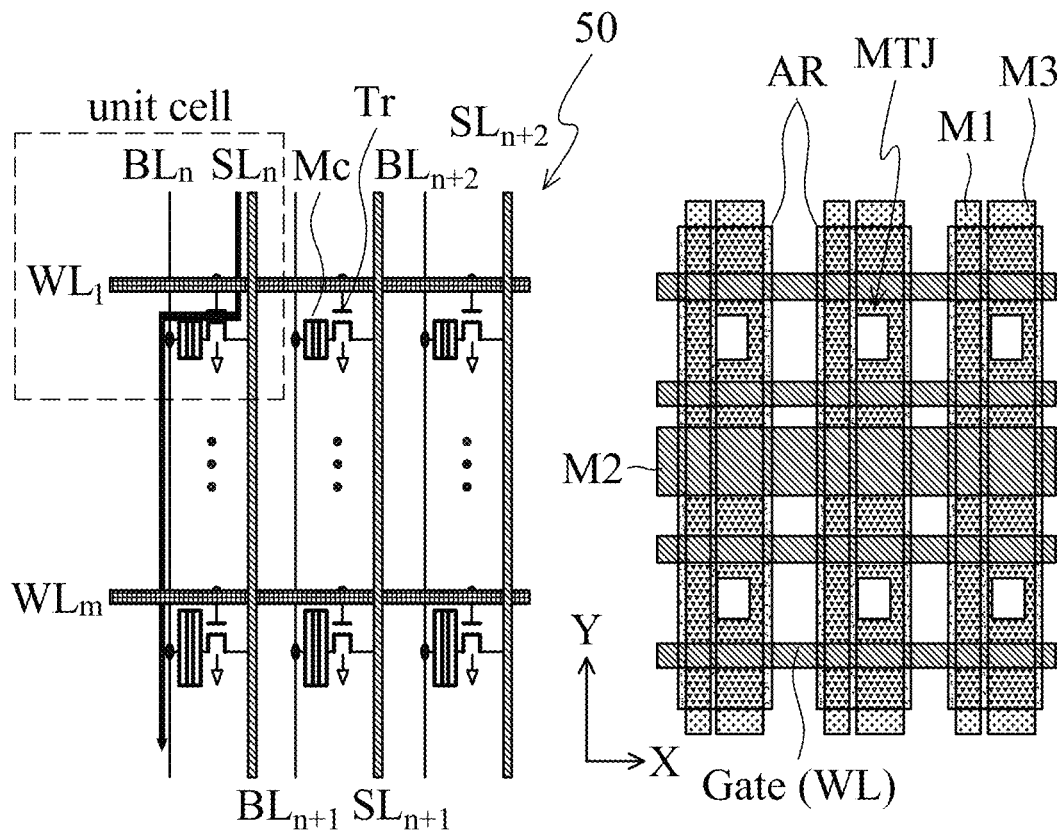
FIG. 4A
FIG. 4C
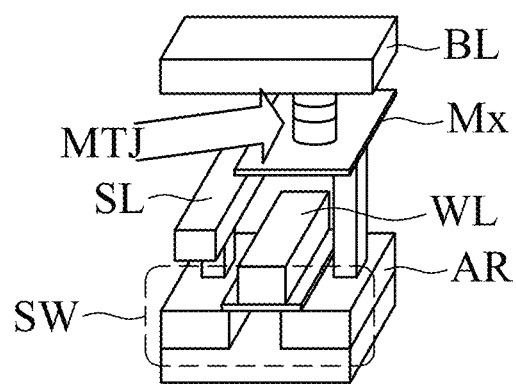
FIG. 4B

MAGNETIC RANDOM ACCESS MEMORY AND MANUFACTURING METHOD THEREOF

RELATED APPLICATION

This applicant claims priority to U.S. Provisional Patent Application No. 63/166,883 filed Mar. 26, 2021, the entire contents of which are incorporated herein by reference.

BACKGROUND

A magnetic random access memory (MRAM) is a device based on a magnetic tunnel junction cell formed with a semiconductor device, and offers comparable performance to volatile static random access memory (SRAM) and comparable density with lower power consumption to volatile dynamic random access memory (DRAM). Compared to non-volatile memory (NVM) flash memory, an MRAM offers much faster access times and suffers minimal degradation over time, whereas a flash memory can only be rewritten a limited number of times. An MRAM cell is formed by a magnetic tunneling junction (MTJ) comprising two ferromagnetic layers which are separated by a thin insulating barrier, and operates by tunneling of electrons between the two ferromagnetic layers through the insulating barrier.

BRIEF DESCRIPTION OF THE DRAWINGS

FIG. 1A is a schematic view of an MTJ MRAM cell according to an embodiment of the present disclosure.

FIG. 1B is a schematic cross sectional view of the MTJ film stack according to an embodiment of the present disclosure.

FIGS. 3A and 3B show operations of the MTJ film stack.

FIGS. 3C and 3D show operations of the MTJ film stack.

FIG. 4A shows a schematic circuit diagram of an MTJ MRAM, FIG. 4B shows a schematic perspective view of a memory cell of the MTJ MRAM and FIG. 4C shows a memory cell layout of the MTJ MRAM.

DETAILED DESCRIPTION

Figure 2A:
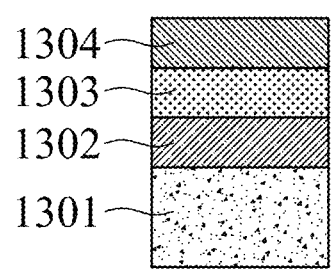
FIGS. 2A, 2B and 2C show schematic cross sectional views of magnetic layers of the MTJ film stack according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

FIG. 1A is a schematic view of a MTJ MRAM cell according to an embodiment of the present disclosure, and FIG. 1B is a schematic cross sectional view of the MTJ film stack. The MTJ cell 100 is disposed between a lower metal layer Mx and an upper metal layer My of a semiconductor device. The metal layers Mx and My are used to connect one element to another element in a semiconductor device formed at a different level above a substrate. Further, the lower metal layer Mx is coupled to a switching device SW, which can be formed by a MOS FET including, but not limited to, a planar MOS FET, a fin FET, a gate-all-around (GAA) FET, or any other switching devices. A control terminal (e.g., a gate terminal of FET) of the switching device is coupled to a word line. The upper metal layer My is coupled to a bit line. In some embodiments, the switching device SW is disposed between the upper metal layer My and the bit line. In some embodiments, the upper metal layer My is the bit line.

The MTJ cell 100 shown in FIG. 1B includes a first electrode layer 110 coupled to the lower metal layer Mx and a second electrode layer 155 coupled to the upper metal layer My. An MTJ film stack 101 is disposed between the first electrode layer 110 and the second electrode layer 155. In some embodiments of the present disclosure, the second electrode layer 155 is not used and the MTJ film stack 101 directly contacts the upper metal layer My.

The MTJ film stack (MTJ functional layer) 101 includes a first pinned magnetic layer 130, a free magnetic layer 140, and a tunneling barrier layer 135 made of a non-magnetic material and disposed between the first pinned magnetic layer 130 and the free magnetic layer 140. The free magnetic layer 140 and the first pinned magnetic layer 130 include one or more ferromagnetic materials that can be magnetically oriented, respectively. The first pinned magnetic layer 130 is configured such that the magnetic orientation is fixed and will not respond to a typical magnetic field. In some embodiments, the thickness of the free magnetic layer 140 is in a range from about 0.8 nm to about 1.5 nm. In some embodiments, the thickness of the second pinned layer 130 is in a range from about 0.8 nm to about 2.0 nm.

The tunneling barrier layer 135 includes a relatively thin oxide layer capable of electrically isolating the free magnetic layer 140 from the first pinned magnetic layer 130 at low potentials and capable of conducting current through electron tunneling at higher potentials. In some embodiments, the tunneling barrier layer 135 includes magnesium oxide (MgO) having a thickness in a range from about 0.5 nm to about 1.2 nm.

The MTJ film stack 101 further includes an antiferromagnetic layer 125, as shown in FIG. 1B. The anti-ferromagnetic layer 125 is used to fix the magnetic orientation of the first pinned magnetic layer 130. The antiferromagnetic layer 125 includes ruthenium (Ru) or any other suitable antiferromagnetic material. In some embodiments, the thickness of the antiferromagnetic layer 125 is in a range from about 0.4 nm to about 1.0 nm.

The MTJ film stack 101 further includes a second pinned magnetic layer 120 including one or more magnetic materials, as shown in FIG. 1B.

The first electrode layer 110 is formed on the lower metal layer Mx made of, for example, Cu, Al, W, Co, Ni, and/or an alloy thereof; and the upper metal layer My made of, for example, Cu, Al, W, Co, Ni, and/or an alloy thereof, is formed on the second electrode layer 155.

The first pinned magnetic layer 130 includes multiple layers of magnetic materials. In some embodiments, as shown in FIG. 2A, the first pinned magnetic layer 130 includes four layers 1301, 1302, 1303 and 1304, where the uppermost layer 1304 is in contact with the tunneling barrier layer 135 and the bottommost layer 1301 is in contact with the antiferromagnetic layer 125. In some embodiments, the bottommost layer 1301 includes a multilayer structure of cobalt (Co) and platinum (Pt). In some embodiments, a thickness of the cobalt layer is in a range from about 0.3 nm to about 0.6 nm and a thickness of the platinum layer is in a range from about 0.2 nm to about 0.5 nm. The thickness of the cobalt layer can be the same as or greater than the platinum layer. The cobalt layers and the platinum layers are alternately stacked such that the total thickness of the bottommost layer 1301 is in a range from about 2.0 nm to about 5.0 nm in some embodiments. The layer 1302 includes a cobalt layer having a thickness in a range from about 0.4 nm to about 0.6 nm. In certain embodiments, the bottommost layer 1301 includes the cobalt layer and the layer 1302 is the multilayer of the cobalt layers and the platinum layers as set forth above. In this disclosure, an "element" layer generally means that the content of the "element" is more than 99%.

The layer 1303 is a spacer layer. The thickness of the spacer layer 1303 is in a range from about 0.2 nm to about 0.5 nm in some embodiments.

The uppermost layer 1304 includes a cobalt iron boron (CoFeB) layer, a cobalt/palladium (CoPd) layer and/or a cobalt iron (CoFe) layer. The thickness of the layer 1304 is in a range from about 0.8 nm to about 1.5 nm in some embodiments.

Figure 2B:
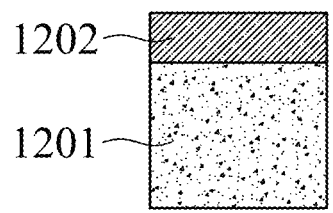

The second pinned magnetic layer 120 includes multiple layers of magnetic materials in some embodiments. In some embodiments, as shown in FIG. 2B, the second pinned magnetic layer 120 includes two layers 1201 and 1202, where the upper layer 1202 is in contact with the antiferromagnetic layer 125. In some embodiments, the lower layer 1201 includes a multilayer structure of cobalt (Co) and platinum (Pt). In some embodiments, a thickness of the cobalt layer is in a range from about 0.3 nm to about 0.6 nm and a thickness of the platinum layer is in a range from about 0.2 nm to about 0.5 nm. The thickness of the cobalt layer can be the same as or greater than the platinum layer. The cobalt layers and the platinum layers are alternately stacked such that the total thickness of the lower layer 1201 is in a range from about 5.0 nm to about 10.0 nm in some embodiments. The upper layer 1202 includes a cobalt layer having a thickness in a range from about 0.4 nm to about 0.6 nm.

Figure 2C:
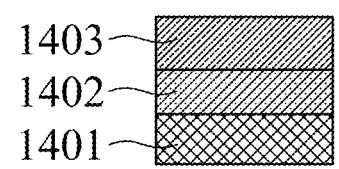

The free magnetic layer 140 includes a cobalt iron boron (CoFeB) layer, a cobalt/palladium (CoPd) layer and/or a cobalt iron (CoFe) layer having a thickness in a range from about 1.0 nm to about 2.0 nm in some embodiments. In other embodiments, the free magnetic layer 140 includes multiple layers of magnetic materials. In some embodiments, as shown in FIG. 2C, the free magnetic layer 140 includes three layers 1401, 1402 and 1403, where the lower layer 1401 is in contact with the tunneling barrier layer 135. The lower and upper layers 1401 and 1403 are a cobalt iron boron (CoFeB) layer, a cobalt/palladium (CoPd) layer and/or a cobalt iron (CoFe) layer having a thickness in a range from about 1.0 nm to about 2.0 nm in some embodiments. The middle layer 1402 is a spacer layer. The thickness of the spacer layer 1402 is in a range from about 0.2 nm to about 0.6 nm in some embodiments.

In some embodiments, the spacer layer 1303 and/or the spacer layer 1402 include an iridium layer and/or a binary alloy layer of iridium and tantalum. A spacer layer for the MTJ film stack is generally required to have a super smooth surface morphology and a high electric conductivity and to be substantially free from diffusion issue. Further, the spacer layer should also be tolerant to a low level of oxidation without significant degradation of its conductivity. The thickness of the spacer layers 1303 and/or 1402 is in a range from about 0.1 nm to about 10 nm in some embodiments, and is in a range from about 0.5 nm to about 5.0 nm in other embodiments.

The MTJ film stack 101 further includes a seed layer 115 formed on the first electrode layer 110, a capping layer 145 formed on the free magnetic layer 140, and a diffusion barrier layer 150 formed on the capping layer 145, as shown in FIG. 1B. The capping layer 145 includes a dielectric material, such as magnesium oxide or aluminum oxide, and has a thickness in a range from about 0.5 nm to about 1.5 nm in some embodiments. In some embodiments, the diffusion barrier layer 150 includes a metallic material, such as Ru, Ta, Mo or other suitable material, and has a thickness in a range from about 0.5 nm to about 1.5 nm. In some embodiments one or both of the capping layer 145 and the diffusion barrier layer 150 are not used. In some embodiments, the seed layer 115 is made of one or more of iridium (Ir), tantalum (Ta), molybdenum (Mo), cobalt (Co), nickel (Ni), ruthenium (Ru) or platinum (Pt) or an alloy thereof.

The first electrode layer 110 includes a conductive material, such as a metal (e.g., Ta, Mo, Co, Pt, Ni), to reduce the resistance for programming. The second electrode layer 155 also includes a conductive material, such as a metal, to reduce the resistivity during reading.

The pinned magnetic layer, the free magnetic layer and the antiferromagnetic layer can also be formed by physical vapor deposition (PVD), molecular beam epitaxy (MBE), pulsed laser deposition (PLD), atomic layer deposition (ALD), electron beam (e-beam) epitaxy, chemical vapor deposition (CVD), or derivative CVD processes, including low pressure CVD (LPCVD), ultrahigh vacuum CVD (UHVCVD), reduced pressure CVD (RPCVD), or any combinations thereof, or any other suitable film deposition method. The tunneling barrier layer and the diffusion barrier layer can also be formed by CVD, PVD or ALD or any other suitable film deposition method.

FIGS. 3A-3D show a memory operation of MTJ cell. As shown in FIGS. 3A-3D, the MTJ cell includes a pinned magnetic layer 10, a tunneling barrier layer 15 and a free magnetic layer 20. The pinned magnetic layer 10 corresponds to the first pinned magnetic layer 130 or the combination of the second pinned magnetic layer 120, the antiferromagnetic layer 125 and the first pinned magnetic layer 130 of FIG. 1B. The tunneling barrier layer 15 corresponds to the tunneling barrier layer 135 of FIG. 1B and the free magnetic layer 20 corresponds to the free magnetic layer 140 of FIG. 1B. In FIGS. 3A-3D, the remaining layers are omitted. A current source 30 is coupled to the MTJ structure in series.

In FIG. 3A, the pinned magnetic layer 10 and the free magnetic layer 20 are magnetically oriented in opposite directions. In some embodiments, the spin directions of the pinned magnetic layer 10 and the free magnetic layer 20 are parallel to the film stack direction (perpendicular to the surface of the films). In FIG. 3B, the pinned magnetic layer 10 and the free magnetic layer 20 are magnetically oriented in the same direction. In other embodiments, the spin directions of the pinned magnetic layer 10 and the free magnetic layer 20 are perpendicular to the film stack direction (parallel with the surface of the films), as shown in FIGS. 3C and 3D. In FIG. 3C, the pinned magnetic layer 10 and the free magnetic layer 20 are magnetically oriented in opposite directions, while in FIG. 3D, the pinned magnetic layer 10 and the free magnetic layer 20 are magnetically oriented in the same direction.

If the same current value $I_C$ is forced to flow through the MTJ cell by the current source 30, it is found that the cell voltage $V_1$ in the case of FIG. 3A (or FIG. 3C) is larger than the cell voltage $V_2$ in the case of FIG. 3B (or FIG. 3D), because the resistance of an opposite-oriented MTJ cell shown in FIG. 3A (or FIG. 3C) is greater than the resistance of a same-oriented MTJ cell shown in FIG. 3B (or FIG. 3D). Binary logic data ("0" and "1") can be stored in a MTJ cell and retrieved based on the cell orientation and resulting resistance. Further, since the stored data does not require a storage energy source, the cell is non-volatile.

FIG. 4A shows a schematic circuit diagram of an MTJ MRAM array 50. Each memory cell includes a MTJ cell Mc and a transistor Tr, such as a MOS FET. The gate of the transistor Tr is coupled to one of word lines $WL_1 \ldots WL_m$ and a drain (or a source) of the transistor Tr is coupled to one end of the MTJ cell Mc, and another end of the MTJ cell is coupled to one of bit lines $BL_n$, $BL_{n+1}$ and $BL_{n+2}$. Further, in some embodiments, signal lines (not shown) for programming are provided adjacent to the MTJ cells.

A memory cell is read by asserting the word line of that cell, forcing a reading current through the bit line of that cell, and then measuring the voltage on that bit line. For example, to read the state of a target MTJ cell, the word line is asserted to turn ON the transistor Tr. The free magnetic layer of the target MTJ cell is thereby coupled to one of the fixed potential lines $SL_n$, $SL_{n+1}$ and $SL_{n+2}$, e.g., the ground, through the transistor Tr. Next, the reading current is forced on the bit line. Since only the given reading transistor Tr is turned ON, the reading current flows through the target MTJ cell to the ground. The voltage of the bit line is then measured to determine the state ("0" or "1") of the target MTJ cell. In some embodiments, as shown in FIG. 4A, each MTJ cell has one reading transistor Tr. Therefore, this type of MRAM architecture is called 1T1R. In other embodiments, two transistors are assigned to one MTJ cell, forming a 2T1R system. Other cell array configurations can be employed.

FIG. 4B shows a schematic perspective view of a memory cell of the MTJ MRAM and FIG. 4C shows a memory cell layout of the MTJ MRAM.

As shown in FIGS. 4B and 4C, the MTJ cell MTJ is disposed above a switching device SW, such as a MOS FET. The gate Gate of the MOSFET is a word line WL or coupled to a word line formed by a metal layer. The bottom electrode Mx of the MTJ cell is coupled to a drain of the MOS FET formed in an active region AR and a source of the MOS FET formed in the active region AR is coupled to the source line SL. The upper electrode of the MTJ cell is coupled to a bit line BL. In some embodiments, the source line SL can be formed by metal layers M1 and M2, and the bit line BL can be formed by a metal layer M3. In certain embodiments, one of more metal wirings is a single device layer, and in other embodiments, one or more metal wirings are double or more device layers.

Figure 5A:
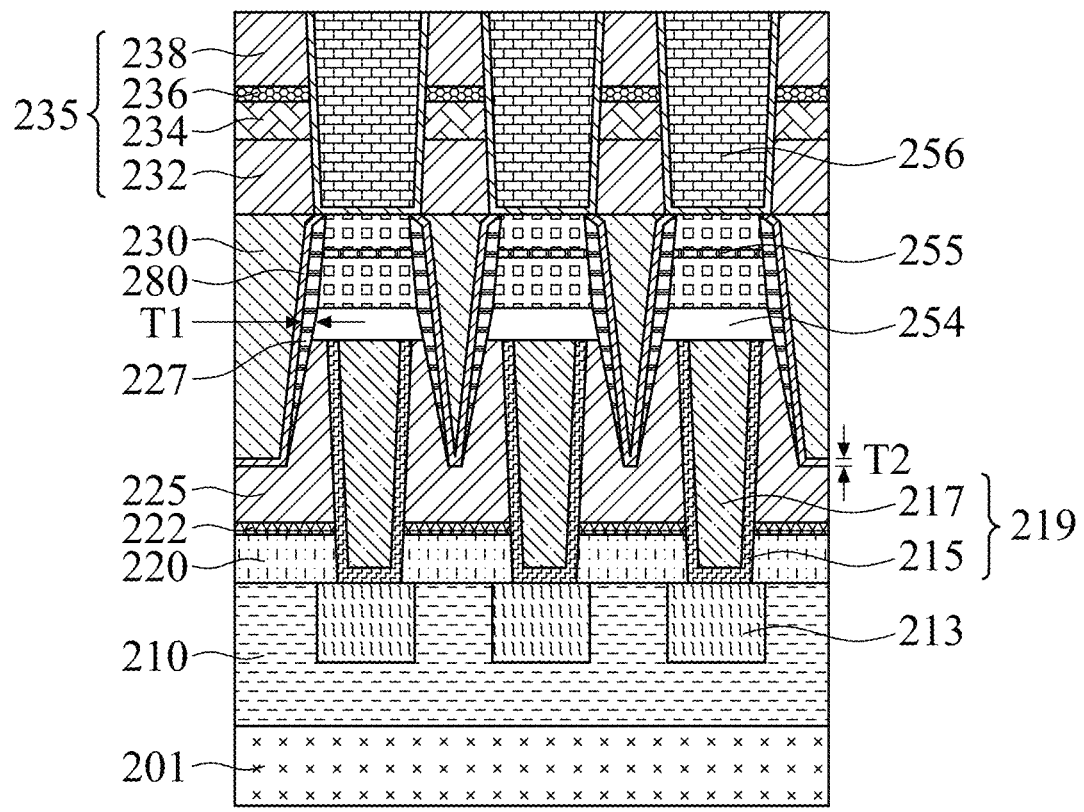
FIGS. 5A and 5B show cross sectional view of a semiconductor device including an MRAM according to embodiments of the present disclosure.

FIG. 5A shows a cross sectional views of a MTJ MRAM according to embodiments of the present disclosure. Material, configuration, dimensions and/or processes the same as or similar to the foregoing embodiments described with FIGS. 1A-4C may be employed in the following embodiments, and detailed explanation thereof may be omitted.

As shown in FIG. 5A, the MTJ cells of an MRAM are disposed over a substrate 201. In some embodiments, the substrate 201 includes a suitable elemental semiconductor, such as silicon, diamond or germanium; a suitable alloy or compound semiconductor, such as Group-IV compound semiconductors (e.g., silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 201 may include an epitaxial layer (epi-layer), which may be strained for performance enhancement, and/or may include a silicon-on-insulator (SOI) structure.

Various electronic devices (not shown), such as transistors (e.g., MOS FET), are disposed on the substrate 201. The MOS FET may include a planar MOS FET, a fin FET and/or a gate-all-around FET. A first interlayer dielectric (ILD) layer 210 is disposed over the substrate 201 to cover the electronic devices. The first ILD layer 210 may be referred to as an inter-metal dielectric (IMD) layer. The first ILD layer 210 includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the first ILD layer 210 is formed through a process such as CVD, flowable CVD (FCVD), or a spin-on-glass process, although any acceptable process may be utilized. Subsequently, a planarization process, such as chemical mechanical polishing (CMP) and/or an etch-back process, or the like is performed.

Further, a lower metal wiring 213 is formed by, for example, a damascene process. The lower metal wiring 213 includes one or more layers of conductive material, such as Cu, a Cu alloy, Al or any other suitable conductive materials. Each of the MTJ cells is disposed over the lower metal wiring 213, as shown in FIG. 5A. Although FIG. 5A shows three MTJ cells, the number of the MTJ cells is not limited to three.

As shown in FIG. 5A, a first insulating layer 220 functioning as an etch stop layer is formed on the first ILD layer 210. In some embodiments, the first insulating layer 220 includes a material different from the first ILD layer 210 and includes silicon carbide, silicon nitride, aluminum oxide or any other suitable material. The thickness of the first insulating layer 220 is in a range from about 10 nm to about 25 nm in some embodiments. In some embodiments, an additional insulating layer 222 functioning as an etch stop layer is formed on the first insulating 220 and includes silicon carbide, silicon nitride, aluminum oxide or any other suitable material, different from the first insulating layer 220.

A second ILD layer 225 is formed over the second insulating layer 222. The second ILD layer includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the material for the first ILD layer 210 and the material for the second ILD layer 225 are the same. In other embodiments, different dielectric materials are used for the first ILD layer 210 and the second ILD layer 225.

A via contact 219 is formed in contact with the lower metal wiring 213 and passing through the second ILD layer 225 and the first and second insulating layers 220, 222 in some embodiments. In some embodiments, the via contact 219 includes a liner or barrier layer 215 and a body layer 217. The liner layer 215 includes one or more layers of Ti, TiN, Ta or TaN, or other suitable material, and the body layer 217 includes one or more layers of W, Cu, Al, Mo, Co, Pt, Ni, and/or an alloy thereof or other suitable material, in some embodiments.

An MRAM cell includes a bottom electrode 254, an MTJ film stack 255 and a top electrode 256, as shown in FIG. 5A. The bottom electrode 254 and the MTJ film stack 255 correspond to the first electrode 110 and the MTJ film stack 101 of FIG. 1B. In some embodiments, the top electrode 256 corresponds to the second electrode 155 of FIG. 1B or the wiring layer My of FIG. 1A. In some embodiments, the top electrode 256 is made of, for example, Cu, Al, Ta, Ti, Mo, Co, Pt, Ni, W, TiN and/or TaN and/or an alloy thereof or other suitable material. In some embodiments, the top electrode 256 includes one or more liner or barrier layer and a body metal layer. In some embodiments, the liner or barrier layer is made of Ta, TaN and/or Co, and the body metal layer is made of Cu or a Cu alloy (e.g., AlCu). In some embodiments, the thickness of the top electrode 256 is in a range from about 100 nm to about 1000 nm.

The MRAM cell structure has a tapered shape in some embodiments, as shown in FIG. 5A. The width of the MRAM cell structure at the bottom (the bottom electrode 254) is greater than the width at the top. The thickness of the bottom electrode 254 is in a range from about 5 nm to about 20 nm in some embodiments. The thickness of the MTJ film stack 255 is in a range from about 15 nm to about 50 nm in some embodiments.

In some embodiments, a first insulating cover layer 227 as a sidewall spacer layer is formed on opposing side walls of the MRAM cell structure. The first insulating cover layer 227 includes one or more layers of insulating material. In some embodiments, a nitride-based insulating material is used. In certain embodiments, the nitride-based insulating material is a silicon nitride-based insulating material, such as silicon nitride, SiON, SiON, SiCN and SiOCN. The thickness T1 of the first insulating cover layer 227 (a horizontal largest width) is in a range from about 5 nm to about 30 nm in some embodiments, and is in a range from about 10 nm to about 20 nm in other embodiments.

Further, a second insulating cover layer 280 is formed over the first insulating cover layer 227 in some embodiments. The second insulating cover layer 280 includes one or more layers of insulating material different from the first insulating cover layer 227. In some embodiments, an aluminum-based insulating material is used. In certain embodiments, the aluminum-based insulating material includes aluminum oxide, aluminum nitride, aluminum oxynitride, aluminum carbide and/or aluminum oxycarbide. In some embodiments, the concentrations of Al, O, C and/or N in the thickness direction are not uniform. In certain embodiments, the concentration of Al gradually decreases from the bottom to the top of the second insulating cover layer 280, while the concentrations of O, C and/or N gradually increase from the bottom to the top of the second insulating cover layer 280. The thickness T2 of the second insulating cover layer 280 is smaller than the thickness T1 of the first insulating cover layer (a horizontal largest width) in some embodiments. The thickness T2 is in a range from about 1 nm to about 10 nm in some embodiments, and is in a range from about 3 nm to about 5 nm in other embodiments.

Further a third ILD layer 230 is disposed in spaces between the MRAM cell structures. The third ILD layer 230 includes one or more dielectric layers, such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the material for the first ILD layer 210, the material for the second ILD layer 225 and the material for the third ILD layer 230 are the same. In other embodiments, at least two of them are made of different dielectric materials.

Further, a fourth ILD layer 235 is disposed over the third ILD layer 230. In some embodiments, the fourth ILD 235 layer is a multiple layer structure and includes a first dielectric layer 232 as an etch stop layer formed on the third ILD layer 230, a second dielectric layer 234 formed on the first dielectric layer 232, a third dielectric layer 236 formed on the second dielectric layer 234 and a fourth dielectric layer 238 formed on the third dielectric layer 236. In other embodiments, the fourth ILD layer is a two-layer structure without one of the first or second dielectric layers.

In some embodiments, the first dielectric layer 232, the second dielectric layer 234 and the fourth dielectric layer 238 are made of different material than the third dielectric layer 236 and include one or more layers of silicon oxide, silicon nitride, SiON, SiOCN, SiCN, SiC or any other suitable material. In some embodiments, the first dielectric layer 232 and second dielectric layer 234 are made of different materials from each other.

One or more of the first dielectric layer 232, the second dielectric layer 234 and the fourth dielectric layer 238 include a fluorine-doped silicate glass (FSG), low-k dielectrics such as carbon doped oxides, extremely low-k dielectrics such as porous carbon doped silicon dioxide, a polymer such as polyimide, combinations of these, or the like.

In some embodiments, the third dielectric layer 236 includes an aluminum-based insulating material, such as, aluminum oxide, aluminum nitride, aluminum oxynitride, aluminum carbide and/or aluminum oxycarbide. In other embodiments, the third dielectric layer includes a Zr or Zn based insulating material (Zr oxide, Zn oxide).

In some embodiments, the material for the first ILD layer 210, the material for the second ILD layer 225, the material for the third ILD layer 230 and the material for the third dielectric layer 240 are the same. In other embodiments, at least two of them are made of different dielectric materials. The thickness of the fourth dielectric layer 238 is greater than the thicknesses of the first, second and third dielectric layers in some embodiments.

Figure 5B:
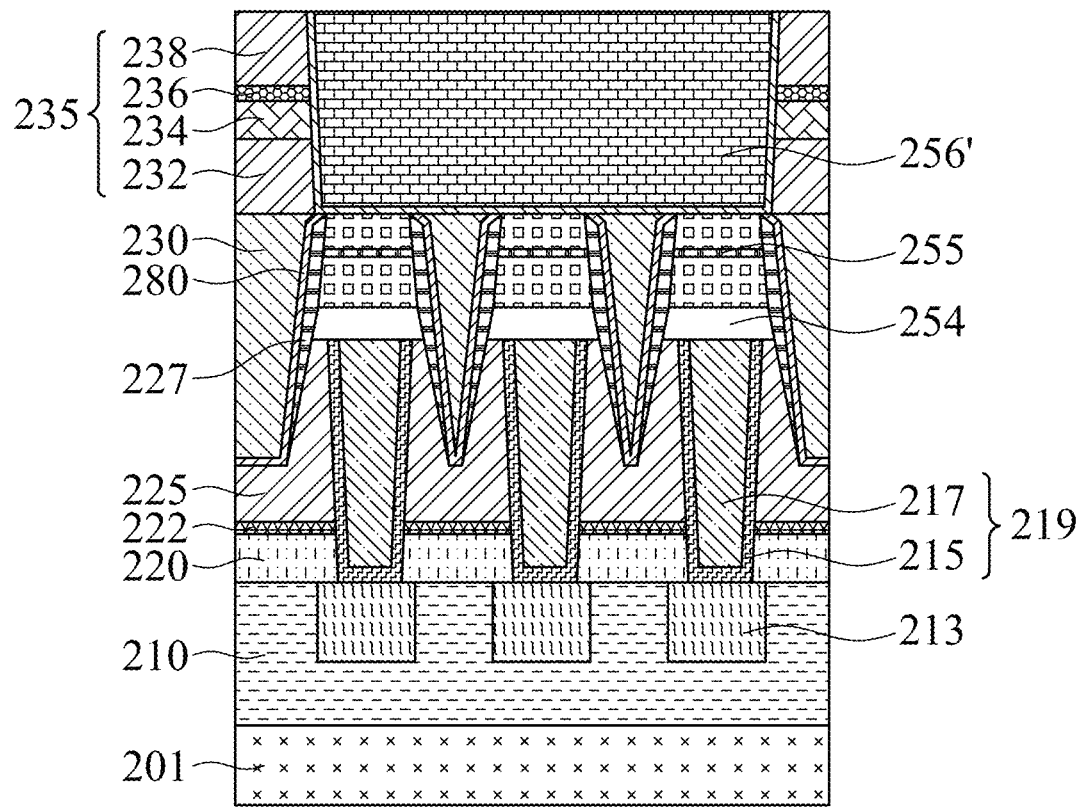

FIG. 5B shows a cross sectional views of a MTJ MRAM according to embodiments of the present disclosure. Material, configuration, dimensions and/or processes the same as or similar to the foregoing embodiments described with FIGS. 1A-5A may be employed in the following embodiments, and detailed explanation thereof may be omitted.

In some embodiments, the top electrode 256' is commonly formed over two or more MRAM cell structures and thus a width of the top electrode 256' depends on the number of MRAM cell structures commonly connected to the top electrode 256'. The materials and/or structures of top electrode 256' are the same as those of the top electrode 256 of FIG. 5A.

FIGS. 6A-18 show various stages of a sequential manufacturing process of the semiconductor device including an MRAM according to an embodiment of the present disclosure. It is understood that additional operations can be provided before, during, and after processes shown by FIGS. 6A-18, and some of the operations described below can be replaced or eliminated, for additional embodiments of the method. Material, configuration, dimensions and/or processes the same as or similar to the foregoing embodiments described with FIGS. 1A-5B may be employed in the following embodiments, and detailed explanation thereof may be omitted.

Figure 6A:
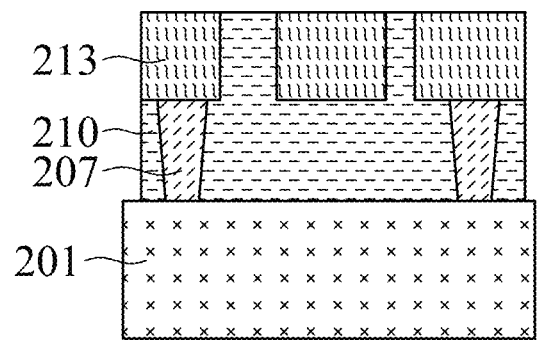
FIGS. 6A, 6B and 6C show various stages of a sequential manufacturing process of a semiconductor device including an MRAM according to an embodiment of the present disclosure.
Figure 6B:
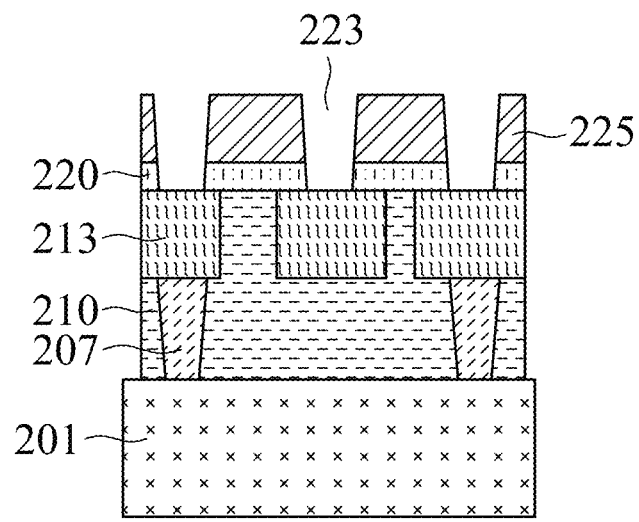
Figure 6C:
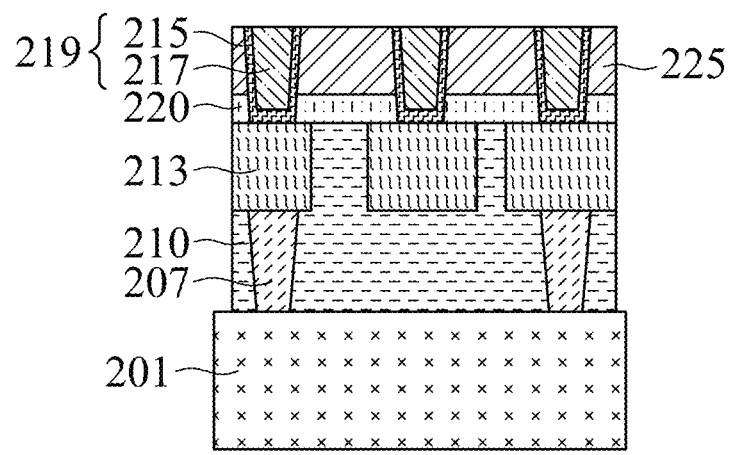

As shown in FIG. 6A, lower metal wirings 213 are formed in the first ILD layer 210 over the substrate 201. In some embodiments, via contacts 207 are provided under the lower metal wirings 213. Then, as shown in FIG. 6B, a first insulating layer 220 as an etch stop layer is formed over the structure of FIG. 6A, and a second ILD layer 225 is formed over the first insulating layer 220. Further, as shown in FIG. 6B, via contact openings 223 are formed to expose the upper surface of the lower metal wirings 213, by using one or more lithography and etching operations. Subsequently, via contact 219 including layers 215 and 217 are formed, as shown in FIG. 6C. One or more film forming operations, such as CVD, PVD including sputtering, ALD, electro-chemical plating and/or electro-plating, are performed, and a planarization operation, such as CMP, is performed to fabricate the via contacts 219.

Figure 7:
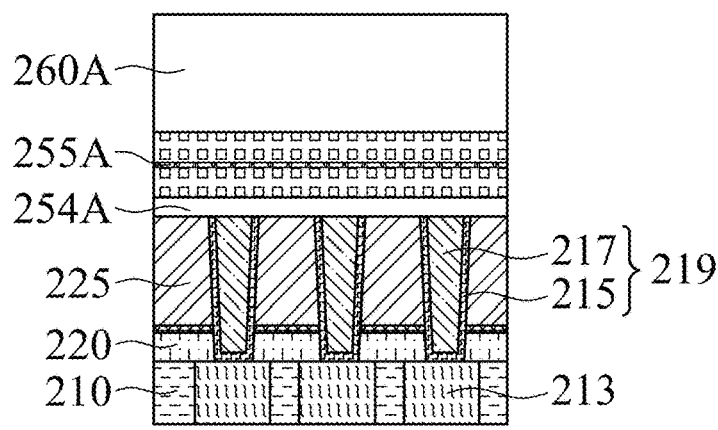
FIGS. 7, 8, 9, 10, 11, 12, 13, 14, 15 and 16 show various stages of a sequential manufacturing process of a semiconductor device including an MRAM according to an embodiment of the present disclosure.

Then, as shown in FIG. 7, a first conductive layer 254A for the bottom electrode 254 is formed over the structure shown in FIG. 6D and subsequently, a stacked layer 255A for the MTJ film stack 255 and a second conductive layer for a hard mask layer 260A are sequentially formed over the first conductive layer 254A. In some embodiments, the hard mask layer 260A includes one or more of Ti, TiN, Ta or TaN. In certain embodiments, the hard mask layer 260A includes TiN with a thickness in a range from about 10 nm to about 200 nm.

Figure 8:
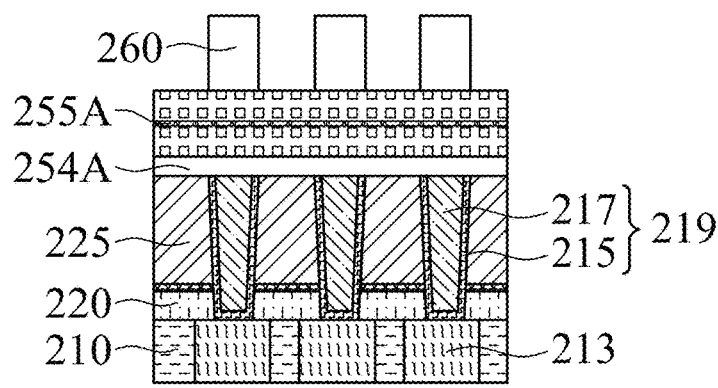
Figure 9:
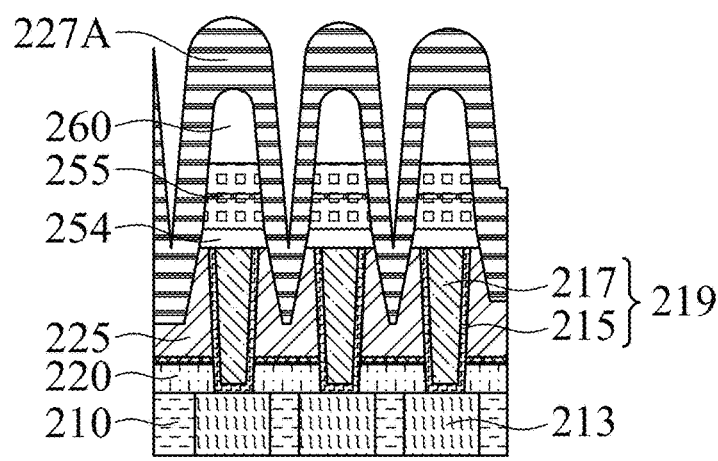

By using one or more lithography and etching operations, the hard mask layer 260A is patterned into the hard mask pattern 260 as shown in FIG. 8. Then, by using the hard mask pattern 260 as an etching mask, the stacked layer 255A and the first conductive layer 254A are patterned into MRAM cell structures each including the bottom electrode 254, the MTJ film stack 255 and the hard mask pattern 260. Subsequently, as shown in FIG. 9, an insulating layer 227A for a first insulating cover layer (sidewall) 227 is formed to cover the MRAM cell structures. The insulating layer 227A can be formed by CVD, PVD or ALD or any other suitable film deposition method. In some embodiments, the insulating layer 227A is formed by CVD, PVD or ALD at a temperature range less than about 150° C., such as a range from about 100° C. to about 150° C. When the insulating layer 227A is formed at a higher temperature, such as a range from about 200° C. to about 300° C. (or more), the film formation process may cause damage to the MTJ film stack 255 since the insulating layer is directly formed on the MTJ film stack 255. As shown in FIG. 9, the insulating layer 227A is conformally formed over the MRAM cell structures in some embodiments.

Figure 10:
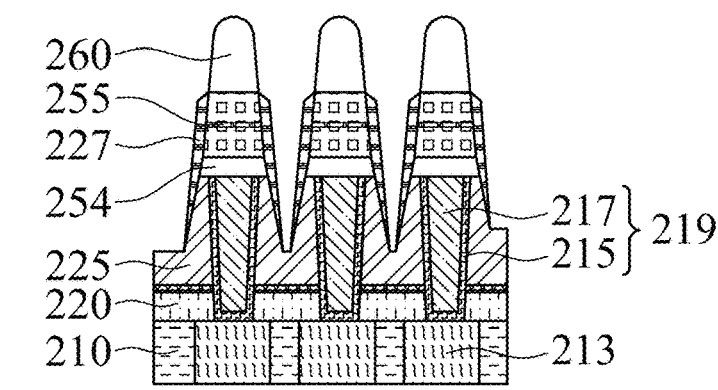

Then, one or more etching operations are performed to partially remove the insulating layer 227A to form a first insulating cover layer 227 as sidewall spacers, as shown in FIG. 10. In some embodiments, anisotropic plasma dry etching is employed. As shown in FIG. 10, the etching stops on the upper surface of the MTJ film stack 255 and the top and the side faces of the hard mask pattern 260 are fully exposed. In some embodiments, a difference between the top of the MTJ film stack 255 and the top of the first insulating cover layer 227 is within ±about 2 nm. In some embodiments, the top of the MTJ film stack is higher than the top of the first insulating cover layer 227. In other embodiments, the top of the MTJ film stack is lower than the top of the first insulating cover layer 227.

Figure 11:
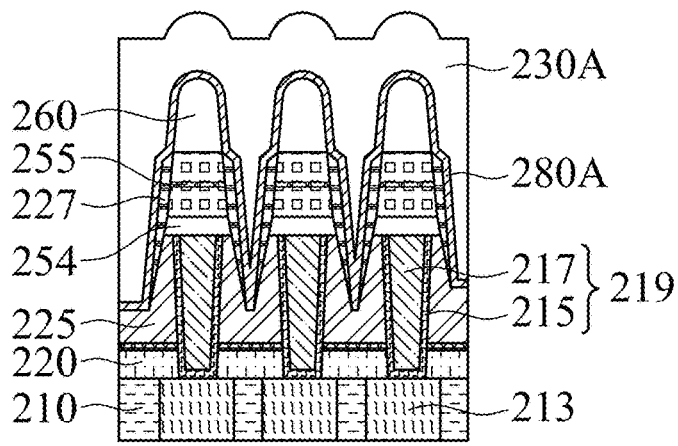

Then, as shown in FIG. 11, an insulating layer 280A for a second insulating cover layer 280 is formed to cover the MRAM cell structure. The insulating layer 280A can be formed by CVD, PVD or ALD or any other suitable film deposition method. As shown in FIG. 11, the insulating layer 280A is conformally formed. As set forth above, the insulating layer 280A for the second insulating cover layer 280 includes an aluminum-based insulating material in some embodiments. The aluminum-based insulating material, such as AlO ($Al_2O_3$), AlN, AlC, AlOC and AlON, can be formed by the following operations. First, an aluminum layer is formed by, for example, metal-organic CVD (MOCVD) or ALD using tri-methyl-aluminum (TMA). Then, a plasma treatment using $NH_3$, $CO_2$ and/or CO gases is performed over the aluminum layer, to convert the aluminum layer into AlO, AlN, AlC, AlOC or AlON. The concentrations of Al, O, C and/or N in the plasma treated aluminum layer are not uniform, in particular, along the vertical direction. The AlON layer may be made of two layers of AlO and AlN. In some embodiments, a thin layer of aluminum having a thickness of less than about 1 nm remains at the bottom of the layer. A chemical oxidation of the aluminum layer using an oxidation solution may be employed. In some embodiments, the AlO, AlOC, AlC, AlN and/or AlON layer can be directly formed by CVD, PVD or ALD or other suitable method by using appropriate source gases. In some embodiments, the insulating layer 280A is formed by CVD, PVD or ALD at a temperature in a range from about 300° C. to about 450° C. Although lower forming temperature (e.g., less than 300° C.) may be employed, since the first insulating cover layer 227 is formed to cover the MTJ film stack 255, a higher forming temperature (about 300° C. to about 450° C.) may not damage the MTJ film stack 255.

Next, as shown in FIG. 11, a dielectric material layer 230A for the third ILD layer 230 is formed to fully cover the insulating layer 280A. In some embodiments, the dielectric material layer 230A is formed by CVD, PVD or ALD.

Figure 12:
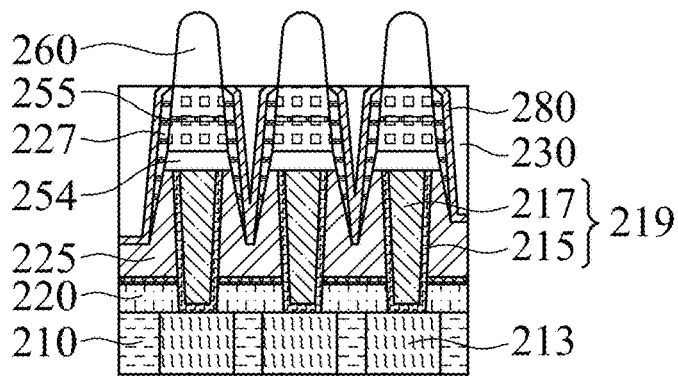

Subsequently, one or more planarization operations, such as a CMP operation or an etch-back operation, are performed to reduce the height of the dielectric material layer 230A, and further, an etch-back operation is performed on the dielectric material layer 230A and the insulating layer 280A to expose the hard mask pattern 260 and to form the second insulating cover layer 280 and the third ILD layer 230, as shown in FIG. 12.

As shown in FIG. 12, the etching stops on the upper surface of the MTJ film stack 255 and the top and the side faces of the hard mask pattern 260 are fully exposed. In some embodiments, a difference between the top of the MTJ film stack 255 and the top of the third ILD layer 230 is within ±about 2 nm. In some embodiments, the top of the MTJ film stack is higher than the top of the third ILD layer 230. In other embodiments, the top of the MTJ film stack is lower than the top of the third ILD layer 230. In some embodiments, a difference between the top of the first insulating cover layer 227, the top of the second insulating cover layer 280, the top of the MTJ film stack 255 and the top of the third ILD layer 230 is within ±about 2 nm.

Figure 13:
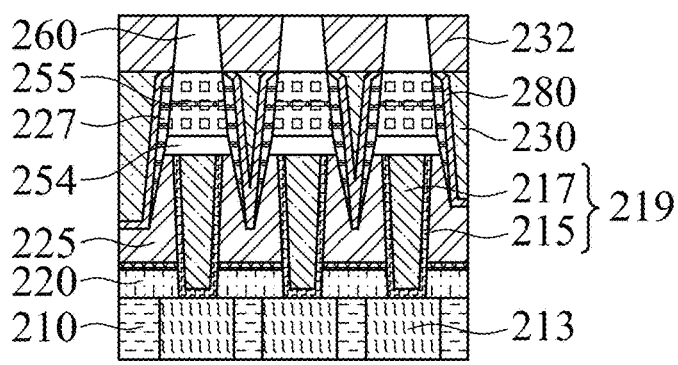

Then, a dielectric layer for the first dielectric layer 232 of the fourth ILD layer 235 is formed over the hard mask pattern 260 and the third ILD layer 230, and then a CMP operation is performed to expose the hard mask pattern 260, as shown in FIG. 13. In some embodiments, the CMP operation stops when the top of the hard mask pattern 260 is exposed or stops after the top of the hard mask pattern 260 is exposed with additional over etching.

Figure 14:
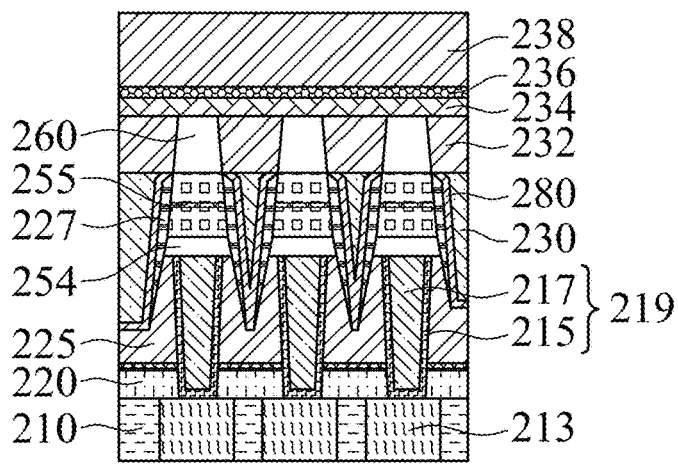

Subsequently, as shown in FIG. 14, the second dielectric layer 234, the third dielectric layer 236 and a fourth dielectric layer 238 of the fourth ILD layer are formed over the first dielectric layer 232 and the exposed hard mask layer 260. The dielectric layers of the fourth ILD layer can be formed by CVD, PVD or ALD or other suitable film formation method. In some embodiments, the fourth dielectric layer 238 is formed through a process such as CVD, flowable CVD (FCVD), or a spin-on-glass process, although any acceptable process may be utilized. Subsequently, a planarization process, such as chemical mechanical polishing (CMP) and/or an etch-back process, or the like is performed.

Figure 15:
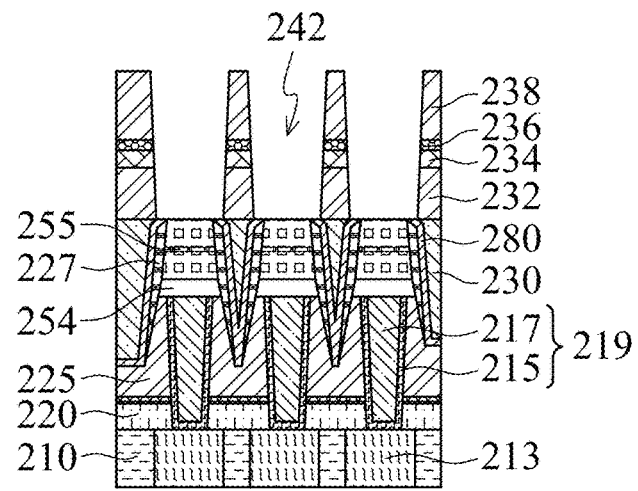

Then, as shown in FIG. 15, contact openings 242 are formed by using one or more lithography and etching operations. As shown in FIG. 15, the etching operations removes the hard mask pattern 260 and the upper surface (the uppermost layer) of the MTJ film stack 255 is exposed at the bottom of the contact opening 242. In some embodiments, the hard mask pattern 260 is fully removed so that no residue of the hard mask pattern (e.g., TiN) remains on the MTJ film stack. In other embodiments, a residue of the hard mask pattern partially covers the upper surface of the MTJ film stack while the remaining part of the upper surface of the MTJ film stack is exposed.

In some embodiments, at the bottom of the contact opening, the top of the first insulating cover layer 227 and the top of the second insulating cover layer 280 are also exposed. In some embodiments, a difference between the top of the first insulating cover layer 227, the top of the second insulating cover layer 280 and the top of the MTJ film stack 255 at the bottom of the contact opening is within ±about 2 nm. In some embodiments, at least one of the top of the first insulating cover layer 227, the top of the second insulating cover layer 280 and the top of the MTJ film stack 255 is located at a different level than one or more of the remaining tops at the bottom of the contact opening. In some embodiments, the top of the third ILD layer 230 is located above the top of the first insulating cover layer 227, the top of the second insulating cover layer 280 and the top of the MTJ film stack 255 in the contact opening.

Figure 16:
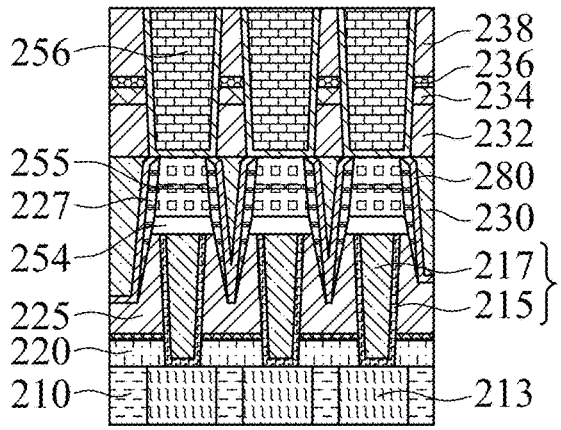

Subsequently, as shown in FIG. 16, the contact openings 242 are filled with a conductive material so as to form conductive contacts 256 contacting the exposed upper surface of the MTJ film stack 255. In some embodiments, the conductive contact 256 includes one or more of liner or barrier layers conformally formed on the inner wall of the contact opening 242 and a body metal layer filling the remaining portion of the contact opening. In some embodiments, the liner or barrier layer is made of Ta, TaN and/or Co, and the body metal layer is made of Cu or a Cu alloy (e.g., AlCu).

In some embodiments, no hard mask layer remains on the top of the MTJ film stack. When the hard mask layer 260 is made of Ti or TiN, no Ti containing layer (e.g., no TiN layer) is disposed between the MTJ film stack 255 and the contact 256.

Figure 19A:
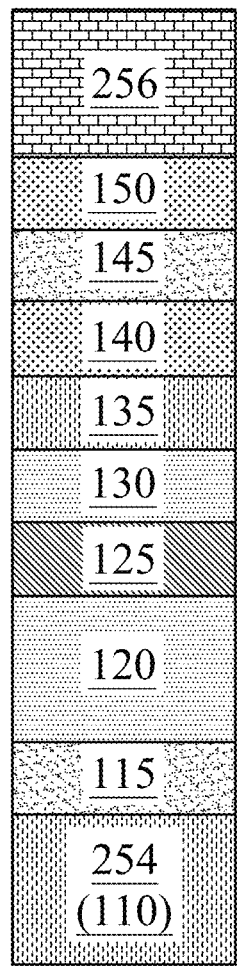
FIGS. 19A, 19B and 19C are schematic cross sectional views of the MTJ film stack and a conductive contact according to embodiments of the present disclosure.
Figure 19B:
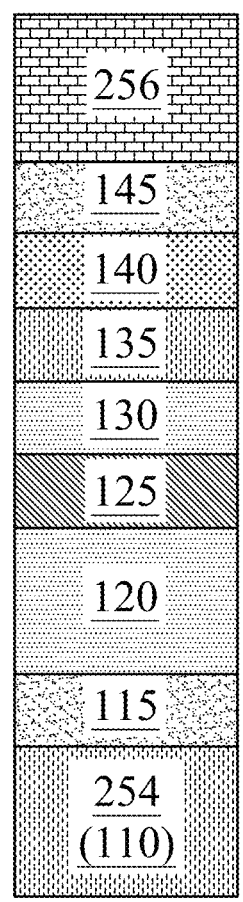
Figure 19C:
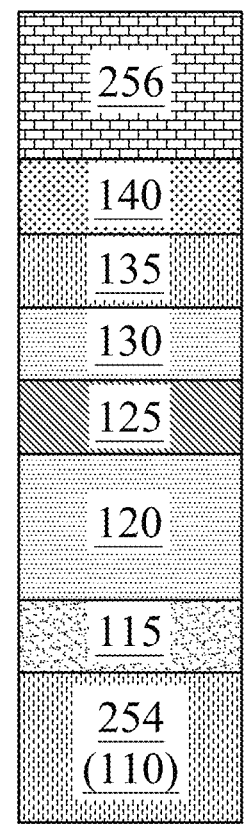

When the uppermost layer of the MTJ film stack 255 is the diffusion barrier layer 150 including a metal material (e.g., Ru, Ta or Mo), the contact 256 is in direct contact with the diffusion barrier layer 150 as shown in FIG. 19A. When the uppermost layer of the MTJ film stack 255 is the capping layer 145 including a dielectric material (e.g., such as magnesium oxide or aluminum oxide), the contact 256 is in direct contact with the capping layer 145 as shown in FIG. 19B. When the uppermost layer of the MTJ film stack 255 is the magnetic layer 140, the contact 256 is in direct contact with the magnetic layer 140 as shown in FIG. 19C. No TiN or Ti containing layer is disposed between the contact 256 and the MTJ film stack 255.

Figure 17:
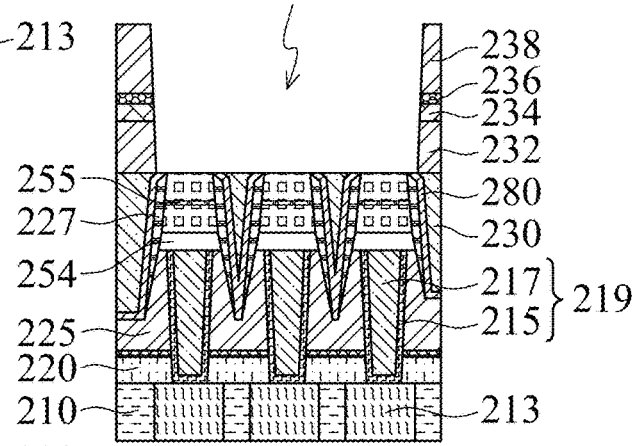
FIGS. 17 and 18 show various stages of a sequential manufacturing process of a semiconductor device including an MRAM according to an embodiment of the present disclosure.
Figure 18:
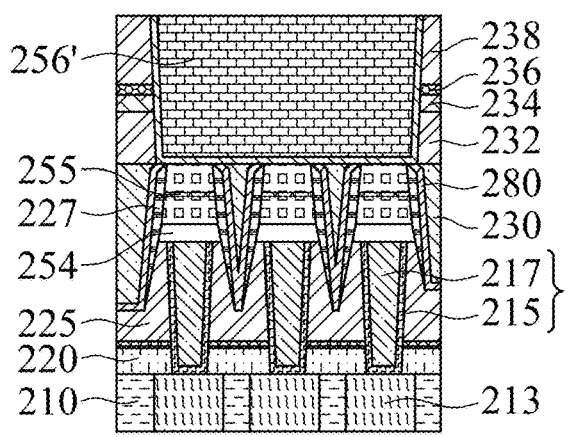

FIGS. 17 and 18 show various stages of a sequential manufacturing process of the semiconductor device including an MRAM corresponding to FIG. 5B. As shown in FIG. 17, a contact opening 242C is formed such that the upper surfaces of two or more MTJ film stacks 255 are exposed at the bottom of the opening 242C. Then, as shown in FIG. 18, a common contact 256' is formed in the contact opening 242C. The materials and processes for the common contact 256' are the same as those for the contact 256.

In some embodiments, the number of MRAM cells (MTJ film stacks) directly connected to the common contact 256' is between 2 to 256, and any of 8, 16, 32, 64, 128 or 256.

Figure 20A:
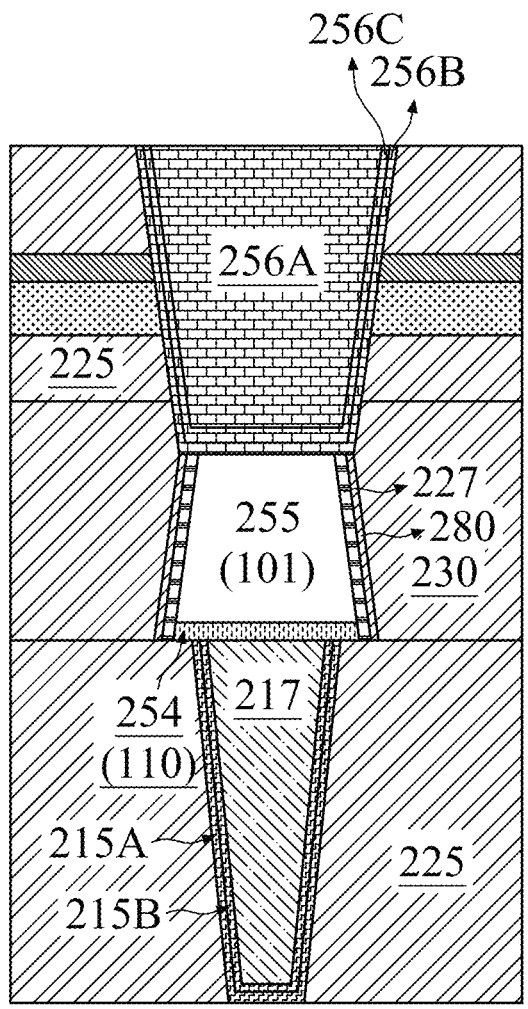
FIGS. 20A and 20B show cross sectional view of a semiconductor device including an MRAM according to embodiments of the present disclosure.
Figure 20B:
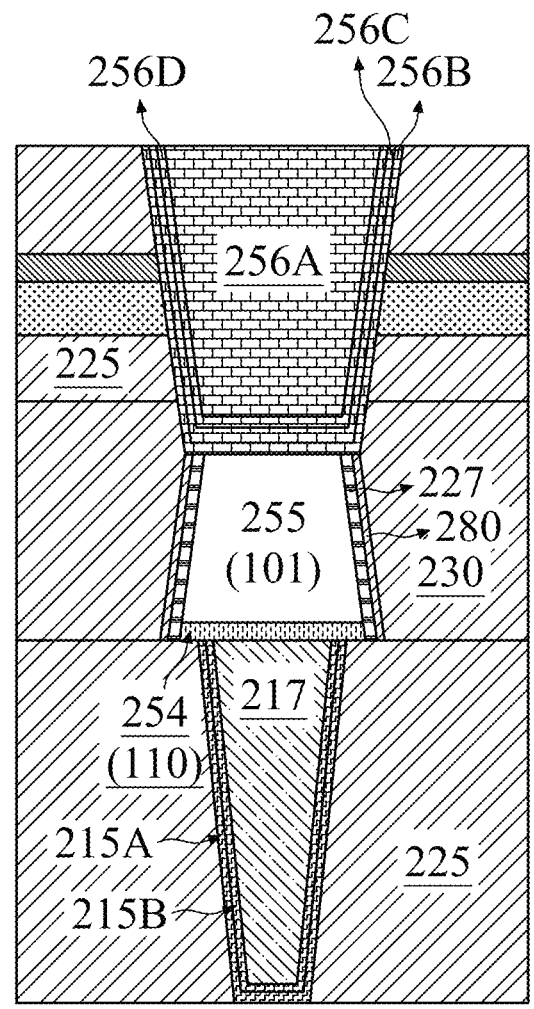

FIGS. 20A and 20B show cross sectional views of an MRAM cell structure according to embodiments of the present disclosure.

As shown in FIGS. 20A and 20B, in some embodiments, the via contact below the MTJ film stack 255 includes a first liner or barrier 215A and a second liner or barrier layer 215B and the body layer 217. The first liner layer 215A is made of TaN and the second liner layer 215B is made of TiN in some embodiments, and the body layer 217 is made of W. In some embodiments, a bottom electrode 254 (first electrode layer 110) is made of TiN.

In an embodiment of FIG. 20A, two barrier or liner layers are used for the contact 256. As shown in FIG. 20A, a first liner layer 256B is formed on the upper surface of the MTJ film stack 255 at the bottom of the contact opening and on the inner sidewall of the contact opening, a second liner layer 256C is formed on the first liner layer, and a body metal layer 256A is formed over the second liner layer 256C. In some embodiments, the first liner layer 256B is made of Ta and the second liner layer 256C is made of TaN. The thickness of the Ta first liner layer is in a range from about 2 nm to about 8 nm and the thickness of the TaN second liner layer is in a range from about 0.5 nm to about 4 nm, in some embodiments. In some embodiments, a ratio of the first liner layer 256B to the second liner layer 256C is about 2 to about 4. When the thicknesses of the first and second liner layers are out of these ranges, a contact resistance between the contact 256 and the MTJ film stack 255 increases.

In other embodiments, the first liner layer 256B is made of TaN and the second liner layer 256C is made of Co. The thickness of the TaN first liner layer is in a range from about 0.5 nm to about 4 nm and the thickness of the Co second liner layer is in a range from about 0.5 nm to about 4 nm, in some embodiments. In some embodiments, a ratio of the first liner layer 256B to the second liner layer 256C is about 0.5 to about 2. When the thicknesses of the first and second liner layers are out of these ranges, a contact resistance between the contact 256 and the MTJ film stack 255 increases.

In an embodiment of FIG. 20B, three barrier or liner layers are used for the contact 256. As shown in FIG. 20B, a first liner layer 256B is formed on the upper surface of the MTJ film stack 255 at the bottom of the contact opening and on the inner sidewall of the contact opening, a second liner layer 256C is formed on the first liner layer, a third liner layer 256D is formed on the second liner layer 256C, and a body metal layer 256A is formed over the third liner layer 256D. In some embodiments, the first liner layer 256B is made of Ta, the second liner layer 256C is made of TaN, and the third liner layer 256D is made of Co. The thickness of the Ta first liner layer is in a range from about 2 nm to about 8 nm, the thickness of the TaN second liner layer is in a range from about 0.5 nm to about 4 nm, and the thickness of the third Co liner layer is in a range from about 0.5 nm to about 4 nm, in some embodiments. In some embodiments, a ratio of the second liner layer 256C to the third liner layer 256D is about 0.5 to about 2. When the thicknesses of the first and second liner layers are out of these ranges, a contact resistance between the contact 256 and the MTJ film stack 255 increases.

The first, second and third liner layers are formed by CVD or ALD in some embodiments, and the body metal layer is formed by CVD, ALD, PVD or electroplating in some embodiments. In some embodiments, no void or seam is formed in the body metal layer 256A.

In some embodiments, the first, second and third liner layers have a U-shape cross section as shown in FIGS. 20A and 20B. In some embodiments, the bottom of the first liner layer 256B is in direct contact with the MTJ film stack 255, the top of the first insulating cover layer 227 and the top of the second insulating cover layer 280. In some embodiments, the bottom of the first liner layer is substantially flat. In some embodiments, a difference among the top of the MTJ film stack 255, the top of the first insulating cover layer 227 and the top of the second insulating cover layer is within ±about 2 nm. In some embodiments, at least one of the top of the first insulating cover layer 227, the top of the second insulating cover layer 280 and the top of the MTJ film stack 255 is located at a different level than one or more of the top of the remaining layers/stacks.

In some embodiments, the cross section of the outer sidewall of the first liner layer contacting the third ILD layer 227 (inner sidewall of the contact opening) has a reverse tapered shape having a bottom smaller than the top as shown in FIGS. 20A and 20B. In some embodiments, the width of the cross section of the contact 256 monotonously increases from the bottom to the top. In some embodiments, the contact 256 does not have a tapered portion (a bottom is greater than a top) in the cross section. In contrast, the cross section of the MTJ film stack 255 has a tapered shape having a bottom greater than the top in some embodiments.

In some embodiments, the width of the contact 256 (the width of the first liner layer 256B) at the bottom of the contact 256 is substantially the same as the width (outer side to outer side) of the second insulating cover layer 280 at the contacting portion to the first liner layer 256B, having a difference therebetween within ±about 2-5 nm. In some embodiments, the width of the contact 256 at the bottom of the contact 256 is greater than the width of the second insulating cover layer 280, and in other embodiments, the width of the contact 256 at the bottom of the contact 256 is smaller than the width of the second insulating cover layer 280.

In some embodiments, the direct contact between the contact 256 and the MTJ film stack decreases contact resistance therebetween. In some embodiments, when the first liner layer 256B is made of Ta and the second liner layer 256C is made of TaN as shown in FIG. 20A, the contact resistance can be reduced by about 3% compared with the structure where the hard mask layer (made of TiN) remains between the contact 256 and the MTJ film stack. In other embodiments, when the first liner layer 256B is made of TaN and the second liner layer 256C is made of Co, the contact resistance can be reduced by about 5.5% compared with the structure where the hard mask layer (made of TiN) remains between the contact 256 and the MTJ film stack.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a cell structure is formed. The cell structure includes a bottom electrode, a magnetic tunnel junction (MTJ) stack disposed on the bottom electrode and a hard mask layer disposed on the MTJ stack. A first insulating cover layer is formed over sidewall of the MTJ stack. A second insulating cover layer is formed over the first insulating cover layer and the hard mask layer. A first interlayer dielectric (ILD) layer is formed. The hard mask layer is exposed by etching the first ILD layer and the second insulating cover layer. A second ILD layer is formed. A contact opening is formed in the second ILD layer by patterning the second ILD layer and removing the hard mask layer. A conductive layer is formed in the contact opening so that the conductive layer contacts the MTJ stack. In one or more of the foregoing and following embodiments, the first insulating cover layer is made of a nitride-based insulating material, and the second insulating cover layer is made of an aluminum-based insulating material different from the nitride-based insulating material. In one or more of the foregoing and following embodiments, the nitride-based insulating material is one or more selected from the group consisting of SiN, SiON and SiOCN. In one or more of the foregoing and following embodiments, the nitride-based insulating material is formed at a temperature in a range from 100° C. to 150° C. In one or more of the foregoing and following embodiments, the aluminum-based insulating material is one or more selected from the group consisting of aluminum oxide, aluminum nitride, aluminum oxynitride, aluminum carbide and aluminum oxycarbide. In one or more of the foregoing and following embodiments, the aluminum-based insulating material is formed at a temperature in a range from 300° C. to 450° C. In one or more of the foregoing and following embodiments, the first insulating cover layer is thicker than the second insulating cover layer. In one or more of the foregoing and following embodiments, the hard mask layer is made of TiN. In one or more of the foregoing and following embodiments, when the second ILD layer is formed, a first layer is formed over the first ILD layer and the hard mask layer that is exposed, a planarization operation is performed on the first layer to expose the hard mask layer, and one or more second layers are formed over the first layer and the hard mask layer that is exposed.

In accordance with another aspect of the present disclosure, in a method of manufacturing a semiconductor device including a magnetic random access memory (MRAM) cell, a first conductive layer is formed over a first interlayer dielectric (ILD) layer, a stacked layer for a magnetic tunnel junction (MTJ) stack is formed over the first conductive layer, a hard mask pattern is formed over the stacked layer, the stacked layer and the first conductive layer are patterned by using the hard mask pattern as an etching mask, thereby forming a cell structure including a bottom electrode formed by the first conductive layer, the magnetic tunnel junction (MTJ) stack and the hard mask pattern, a first insulating layer is formed over the cell structure, a first insulating sidewall is formed by partially etching the first insulating layer, a second insulating layer is formed, a second ILD layer is formed, the hard mask pattern is exposed by etching the second ILD layer and the second insulating layer, a third ILD layer is formed, a contact opening is formed in the third ILD layer by patterning the third ILD layer and by removing the hard mask pattern, and a conductive layer is formed in the contact opening so that the conductive layer contacts the MTJ stack. In one or more of the foregoing and following embodiments, when the conductive layer is formed, one or more liner layers are formed on the MTJ stack and an inner sidewall of the contact opening, and a body metal layer is formed over the one or more liner layers. In one or more of the foregoing and following embodiments, the one or more liner layers includes a first liner layer made of Ta and a second liner layer made of TaN formed over the first liner layer. In one or more of the foregoing and following embodiments, the one or more liner layers includes a first liner layer made of TaN and a second liner layer made of Co formed over the first liner layer. In one or more of the foregoing and following embodiments, the one or more liner layers includes a first liner layer, a second liner layer formed over the first liner layer and a third liner layer formed over the second liner layer. In one or more of the foregoing and following embodiments, the body metal layer is made of Cu or a Cu alloy. In one or more of the foregoing and following embodiments, when the contact opening is formed, the hard mask pattern is fully removed, and no residue of the hard mask layer remains between the conductive layer and the MTJ stack.

In accordance with another aspect of the present disclosure, in a method of manufacturing a semiconductor device, a plurality of cell structures, each including a bottom electrode, a magnetic tunnel junction (MTJ) stack disposed on the bottom electrode and a hard mask layer disposed on the MTJ stack are formed, a first insulating cover layer is formed over sidewall of the MTJ stack, a second insulating cover layer is formed over the first insulating cover layer and the hard mask layer, a first interlayer dielectric (ILD) layer is formed, the hard mask layer is exposed by etching the first ILD layer and the second insulating cover layer, a second ILD layer is formed, a contact opening is formed in the second ILD layer by patterning the second ILD layer and removing the hard mask layer so that the MTJ stack of the plurality of cell structures are exposed in the contact opening, and a conductive layer is formed in the contact opening so that the conductive layer contacts the MTJ stack of the plurality of cell structures so that the plurality of cell structures are electrically connected. In one or more of the foregoing and following embodiments, when the conductive layer is formed, a first liner layer is formed on the MTJ stack and an inner sidewall of the contact opening, a second liner layer is formed on the first liner layer, and a body metal layer is formed over the second liner layer. In one or more of the foregoing and following embodiments, the first liner layer is made of Ta and the second liner layer is made of TaN. In one or more of the foregoing and following embodiments, the first liner layer is made of TaN and the second liner layer is made of Co.

In accordance with another aspect of the present disclosure, a semiconductor device including a magnetic random access memory (MRAM) cell, includes: a magnetic random access memory (MRAM) cell structure disposed over a substrate, the MRAM cell structure including a bottom electrode and a magnetic tunnel junction (MTJ) stack; a first insulating cover layer covering sidewalls of the MTJ stack and the bottom electrode; a second insulating cover layer disposed over the first insulating cover layer; a first dielectric layer formed over the second insulating cover layer; a second dielectric layer formed over the first dielectric layer; and a conductive contact formed in the second dielectric layer and in direct contact with the MTJ stack. In one or more of the foregoing and following embodiments, the first insulting cover layer is made of a nitride-based insulating material, and the second insulting cover layer is made of an aluminum-based insulating material different from the nitride-based insulating material. In one or more of the foregoing and following embodiments, the nitride-based insulating material is one or more selected from the group consisting of SiN, SiON and SiOCN. In one or more of the foregoing and following embodiments, the aluminum-based insulating material is one or more selected from the group consisting of aluminum oxide, aluminum nitride, aluminum oxynitride, aluminum carbide and aluminum oxycarbide. In one or more of the foregoing and following embodiments, the nitride-based insulating material is made of SiN, and the aluminum-based insulating material is one selected from the group consisting of aluminum oxide, aluminum nitride, aluminum oxynitride. In one or more of the foregoing and following embodiments, the first insulting cover layer is thicker than the second insulting cover layer. In one or more of the foregoing and following embodiments, an uppermost layer of the MTJ stack is a Ru layer.

In accordance with another aspect of the present disclosure, a semiconductor device including a magnetic random access memory (MRAM) cell, includes: a magnetic random access memory (MRAM) cell structure disposed over a substrate, the MRAM cell structure including a bottom electrode and a magnetic tunnel junction (MTJ) stack; a first insulating cover layer covering sidewalls of the MTJ stack and the bottom electrode; a second insulating cover layer disposed over the first insulating cover layer; a dielectric layer; and a conductive contact comprising a first liner layer in direct contact with the MTJ stack, a second liner layer disposed on the first liner layer and a body metal layer disposed on the second liner layer. In one or more of the foregoing and following embodiments, the first liner layer is made of Ta and the second liner layer is made of TaN. In one or more of the foregoing and following embodiments, the first liner layer is made of TaN and the second liner layer is made of Co. In one or more of the foregoing and following embodiments, wherein the body metal layer is made of Cu or a Cu alloy. In one or more of the foregoing and following embodiments, the first liner layer is in direct contact with a top of the first insulating cover layer and a top of the second insulating cover layer. In one or more of the foregoing and following embodiments, no TiN layer is disposed between the conductive contact and the MTJ stack. In one or more of the foregoing and following embodiments, an uppermost layer of the MTJ stack is a Ru layer. In one or more of the foregoing and following embodiments, an uppermost layer of the MTJ stack is a magnesium oxide layer or an aluminum oxide layer. In one or more of the foregoing and following embodiments, an uppermost layer of the MTJ stack is a magnetic layer.

In accordance with another aspect of the present disclosure, a semiconductor device including a magnetic random access memory (MRAM) cell, includes: magnetic random access memory (MRAM) cell structures disposed over a substrate, each of the MRAM cell structure including a bottom electrode and a magnetic tunnel junction (MTJ) stack; a first insulating cover layer covering sidewalls of each of the MRAM cell structures; a second insulating cover layer disposed over the first insulating cover layer; a bottom dielectric layer filling a space between adjacent MRAM cell structures; an upper dielectric layer disposed over the bottom dielectric layer; and a common conductive contact in direct contact with the MTJ stack of the MRAM cell structures. In one or more of the foregoing and following embodiments, the first insulting cover layer is made of silicon nitride, and the second insulting cover layer is made of aluminum oxide. In one or more of the foregoing and following embodiments, the conductive contact comprises multiple layers including at least one Co layer. In one or more of the foregoing and following embodiments, the upper dielectric layer includes multiple layers, and the conductive contact passes through the multiple layers.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a cell structure including a bottom electrode, a magnetic tunnel junction (MTJ) stack disposed on the bottom electrode and a hard mask layer disposed on the MTJ stack;
    forming a first insulating cover layer over a sidewall of the MTJ stack;
    forming a second insulating cover layer over the first insulating cover layer and the hard mask layer;
    forming a first interlayer dielectric (ILD) layer;
    exposing the hard mask layer by etching the first ILD layer and the second insulating cover layer;
    forming a second ILD layer over the first ILD layer;
    forming a contact opening in the second ILD layer exposing the MTJ stack by patterning the second ILD layer and removing the hard mask layer; and
    forming a conductive layer in the contact opening so that the conductive layer contacts the MTJ stack.

2. The method of claim 1, wherein:
    the first insulating cover layer is made of a nitride-based insulating material, and
    the second insulating cover layer is made of an aluminum-based insulating material different from the nitride-based insulating material.

3. The method of claim 2, wherein the nitride-based insulating material is one or more selected from the group consisting of SiN, SiON and SiOCN.

4. The method of claim 3 wherein the nitride-based insulating material is formed at a temperature in a range from 100° C. to 150° C.

5. The method of claim 2, wherein the aluminum-based insulating material is one or more selected from the group consisting of aluminum oxide, aluminum nitride, aluminum oxynitride, aluminum carbide and aluminum oxycarbide.

6. The method of claim 5, wherein the second insulating cover layer is formed at a temperature in a range from 300° C. to 450° C.

7. The method of claim 1, wherein the first insulating cover layer is thicker than the second insulating cover layer.

8. The method of claim 1, wherein the hard mask layer is made of TiN.

9. The method of claim 1, wherein the forming the second ILD layer comprises:
    forming a first layer over the first ILD layer and the hard mask layer that is exposed;
    performing a planarization operation on the first layer to expose the hard mask layer; and
    forming one or more second layers over the first layer and the hard mask layer that is exposed.

10. A method of manufacturing a semiconductor device including a magnetic random access memory (MRAM) cell, the method comprising:
    forming a first conductive layer over a first interlayer dielectric (ILD) layer;
    forming a stacked layer for a magnetic tunnel junction (MTJ) stack over the first conductive layer;
    forming a hard mask pattern over the stacked layer;
    patterning the stacked layer and the first conductive layer by using the hard mask pattern as an etching mask, thereby forming a cell structure including a bottom electrode formed by the first conductive layer, the magnetic tunnel junction (MTJ) stack and the hard mask pattern;
    forming a first insulating layer over the cell structure;
    forming a first insulating sidewall by partially etching the first insulating layer;
    forming a second insulating layer over the first insulating layer;
    forming a second ILD layer over the second insulating layer;
    exposing the hard mask pattern by etching the second ILD layer and the second insulating layer;
    forming a third ILD layer over the second ILD layer;
    forming a contact opening in the third ILD layer exposing the MTJ stack by patterning the third ILD layer and by removing the hard mask pattern; and
    forming a second conductive layer in the contact opening so that the second conductive layer contacts the MTJ stack.

11. The method of claim 10, wherein the forming the second conductive layer comprises:
- forming one or more liner layers on the MTJ stack and an inner sidewall of the contact opening; and
- forming a body metal layer over the one or more liner layers.

12. The method of claim 11, wherein the one or more liner layers includes a first liner layer made of Ta and a second liner layer made of TaN formed over the first liner layer.

13. The method of claim 11, wherein the one or more liner layers includes a first liner layer made of TaN and a second liner layer made of Co formed over the first liner layer.

14. The method of claim 11, wherein the one or more liner layers includes a first liner layer, a second liner layer formed over the first liner layer and a third liner layer formed over the second liner layer.

15. The method of claim 11, wherein the body metal layer is made of Cu or a Cu alloy.

16. The method of claim 10, wherein:
- in the forming the contact opening, the hard mask pattern is fully removed, and
- no residue of the hard mask layer remains between the second conductive layer and the MTJ stack.

17. A semiconductor device including a magnetic random access memory (MRAM) cell, comprising:
- a magnetic random access memory (MRAM) cell structure disposed over a substrate, the MRAM cell structure including a bottom electrode and a magnetic tunnel junction (MTJ) stack, the MTJ stack comprising a plurality of layers stacked vertically over the substrate, an uppermost layer of the plurality of layers furthest from the substrate being a capping layer;
- a first insulating cover layer covering sidewalls of the MTJ stack and the bottom electrode;
- a second insulating cover layer different from the first insulating cover layer disposed over the first insulating cover layer;
- a dielectric layer; and
- a conductive contact disposed over the MTJ stack, the conductive contact comprising a first liner layer in direct contact with the capping layer, a second liner layer different from the first liner layer disposed on the first liner layer and a body metal layer disposed on the second liner layer.

18. The semiconductor device of claim 17, wherein the first liner layer is made of Ta and the second liner layer is made of TaN.

19. The semiconductor device of claim 17, wherein the first liner layer is made of TaN and the second liner layer is made of Co.

20. The semiconductor device of claim 17, wherein the body metal layer is made of Cu or a Cu alloy.

* * * * *